(12) United States Patent
Nakashima et al.

(10) Patent No.: US 7,993,455 B2
(45) Date of Patent: Aug. 9, 2011

(54) SILICON MANUFACTURING APPARATUS

(75) Inventors: Junichirou Nakashima, Shunan (JP);
Hiroyuki Oda, Shunan (JP)

(73) Assignee: Tokuyama Corporation (JP)

( * ) Notice: Subject to any disclaimer, the term of this patent is extended or adjusted under 35 U.S.C. 154(b) by 864 days.

(21) Appl. No.: 10/569,149

(22) PCT Filed: Aug. 17, 2004

(86) PCT No.: PCT/JP2004/011774
§ 371 (c)(1),
(2), (4) Date: Feb. 21, 2006

(87) PCT Pub. No.: WO2005/019106
PCT Pub. Date: Mar. 3, 2005

(65) Prior Publication Data
US 2007/0034146 A1    Feb. 15, 2007

(30) Foreign Application Priority Data

Aug. 22, 2003  (JP) ................................. 2003-298641

(51) Int. Cl.
*C30B 21/02* (2006.01)
(52) U.S. Cl. ........ 117/201; 117/104; 117/200; 118/715; 118/718
(58) Field of Classification Search .................. 117/201, 117/200, 104; 118/715, 718
See application file for complete search history.

(56) References Cited

U.S. PATENT DOCUMENTS

| | | | |
|---|---|---|---|
| 5,126,112 A | 6/1992 | Burgie | |
| 5,849,078 A * | 12/1998 | Tomita et al. | 117/102 |
| 6,277,436 B1 * | 8/2001 | Stauf et al. | 427/126.3 |
| 6,861,144 B2 | 3/2005 | Wakamatsu et al. | |

FOREIGN PATENT DOCUMENTS

| | | |
|---|---|---|
| EP | 1285880 A1 | 2/2003 |
| JP | 6298594 A | 10/1994 |
| JP | 2002-029726 A | 1/2002 |
| JP | 2002029726 A | 1/2002 |
| JP | 2003-2627 A | 1/2003 |
| JP | 2003-2628 A | 1/2003 |
| JP | 2003-20216 A | 1/2003 |
| JP | 2003-20217 A | 1/2003 |

* cited by examiner

*Primary Examiner* — Robert M Kunemund
(74) *Attorney, Agent, or Firm* — The Webb Law Firm

(57) ABSTRACT

A polycrystalline silicon production apparatus is provided whereby when deposited silicon is caused to drip down into an underlying collection part by heating the reaction tube inner surface at a temperature equal to or above the melting point of silicon, the silicon melt can be prevented from solidifying at a lower end portion of the reaction tube due to temperature lowering at the lower end portion. When a reaction tube is heated with a high frequency heating coil, the temperature lowering at a lower end portion of the reaction tube is prevented through temperature lowering prevention means which may be an infrared device capable of heating the outer periphery of the lower end portion by means of infrared rays, or which may be a lower end coil that is constituted by a coil near the lower end of the high frequency heating coil and has an increased heating intensity relative to an upper coil.

5 Claims, 11 Drawing Sheets

(a)

(b)

US 7,993,455 B2

SILICON MANUFACTURING APPARATUS

FIELD OF THE INVENTION

The present invention relates to a silicon production apparatus for producing polycrystalline silicon. More particularly, the invention relates to a silicon production apparatus in which a feedstock gas is supplied into a reaction tube heated with a high frequency heating coil to deposit silicon on the inner surface of the reaction tube, and, with at least part of the reaction tube including a lower end portion being heated to or above the melting point of silicon, the deposited silicon is caused to drip down and is collected in a collection part below the reaction tube.

BACKGROUND OF THE INVENTION

There are many known processes for producing silicons used as semiconductors and photovoltaic cell materials, and some processes are performed in the industry.

One of such processes is the so-called Siemens process, in which a silicon rod heated by energization to a silicon deposition temperature is placed in a bell jar, and trichlorosilane ($SiHCl_3$) or monosilane ($SiH_4$) together with a reducing gas such as hydrogen are brought into contact with the rod to deposit silicon.

This process provides high-purity silicon and is performed most commonly in the industry. Because of batchwise deposition, however, the process requires repeating a complicated procedure for every batch, including placement of the silicon rod as a seedbed, energization heating, deposition, cooling and takeout of the silicon rod, as well as bell jar washing.

Meanwhile, methods are proposed for continually producing polycrystalline silicon by use of an apparatus as shown in FIG. 12 herein (for example, JP-A-2003-2627 and JP-A-2002-29726). A silicon production apparatus 100 includes a closed vessel 111 equipped with a reaction tube 102, a gas supply opening 103 for supplying a chlorosilane and hydrogen, and a high frequency heating coil 104 provided around the outer periphery of the reaction tube 102.

The reaction tube 102 is heated with an electromagnetic wave from the high frequency heating coil 104 around the outer periphery thereof, so that the inner surface of the reaction tube 102 is brought to or above the melting point of silicon or to a lower temperature at which silicon can be deposited.

Subsequently, a chlorosilane from the gas supply opening 103 is allowed to contact with the inner surface of the heated reaction tube 102 to deposit silicon.

When the silicon deposition is performed while the inner surface of the reaction tube 102 has a temperature equal to or in excess of the melting point of silicon (first method), the silicon melt deposited in a molten state is allowed to continually drip down from an opening at a lower end portion 102a of the reaction tube 102 and is collected in a silicon collection part 105 provided underneath.

When the silicon deposition is performed while the inner surface of the reaction tube 102 has a temperature below the melting point at which silicon deposition is feasible (second method), solid silicon is temporarily deposited on the inner surface of the reaction tube 102 and the inner surface is heated to a temperature equal to or in excess of the silicon melting point, so that part or whole of the deposit is molten and is allowed to drip down into the silicon collection part 105 provided underneath.

In the reaction apparatus 100, regions in which the silicon deposition should be avoided, for example a gap 107 between the reaction tube 102 and a gas supply tube 106, are filled with a seal gas such as hydrogen. An exhaust gas from reaction in the reaction tube 102 is discharged through a gas discharge tube 108 in the closed vessel 111. The numeral 110 denotes a bulkhead wall made of quartz or the like that shields the high frequency heating coil 104 against the reaction gas atmosphere.

When a silicon deposition region of the inner surface of the reaction tube 102 is heated with the high frequency heating coil 104 to a temperature equal to or in excess of the melting point of silicon, a particularly great amount of heat is released from the lower end portion 102a of the reaction tube 102 and consequently the temperature becomes lower than that of the upper tube surface.

Accordingly, the following problem is encountered when the silicon deposition is performed at a temperature of the inner surface of the reaction tube 102 equal to or in excess of the silicon melting point (first method) or at a temperature below the melting point at which silicon deposition is feasible (second method). That is, when the inner surface of the reaction tube 102 is heated to a temperature equal to or in excess of the melting point of silicon to cause the deposited silicon to melt and drip down into the silicon collection part 105 provided underneath, the silicon melt dripping downward on the inner surface of the reaction tube 102 is cooled at the lower end portion 102a and is partially solidified.

The solidification of the silicon melt at the lower end portion 102a results in growth of a silicon mass hanging like an icicle from the tip of the lower end portion 102a. Thus, the silicon melt cannot be dropped and collected in the silicon collection part 105 appropriately.

If the lower end portion 102a is heated sufficiently with the high frequency heating coil 104 to prevent the silicon melt from solidifying at the lower end portion 102a, the portion above the lower end portion 102a is excessively heated. The results are that silicon fine powder and by-products such as silane oligomers are formed easily and objective silicon yield and energy loss are greatly deteriorated.

To prevent the heat release from the reaction tube 102, a thermal insulating member is often wound around the outer surface of the reaction tube 102. The existing thermal insulating members, however, cannot achieve sufficient thermal insulation of the lower end portion 102a. Furthermore, the silicon melt running on the lower end portion 102a from the inner tube surface to the outer tube surface through the opening, will contact with a lower end portion of the thermal insulating member to deteriorate the thermal insulating member.

The present invention has been made in order to solve the aforesaid problems of the conventional art. It is therefore an object of the invention to provide a silicon production apparatus whereby when deposited silicon is caused to drip down into an underlying collection part by heating the reaction tube inner surface at a temperature equal to or in excess of the melting point of silicon, the silicon melt can be prevented from solidifying at a lower end portion of the reaction tube due to temperature lowering at the lower end portion.

SUMMARY OF THE INVENTION

A silicon production apparatus according to the present invention is a polycrystalline silicon production apparatus comprising:

a reaction tube comprising a carbon material;

a gas supply opening through which a chlorosilane and hydrogen are supplied from above the reaction tube; and a high frequency heating coil provided around the outer periphery of the reaction tube, the high frequency heating coil being capable of heating at least part of the reaction tube including a lower end portion to a temperature equal to or in excess of the melting point of silicon;

wherein the silicon production apparatus further includes temperature lowering prevention means for preventing temperature lowering at the lower end portion of the reaction tube during heating with the high frequency heating coil.

In the above invention, the temperature lowering prevention means prevents the temperature lowering in the lower end portion of the reaction tube while the reaction tube is heated with the high frequency heating coil. Accordingly, when deposited silicon is caused to drip down into an underlying collection part by heating the reaction tube inner surface to a temperature equal to or in excess of the melting point of silicon, the silicon melt can be prevented from solidifying at the lower end portion of the reaction tube.

In a preferred embodiment, the temperature lowering prevention means is an infrared device capable of heating the outer periphery of the reaction tube lower end portion by means of infrared rays.

The infrared device can heat the lower end portion of the reaction tube by infrared rays such that when deposited silicon is caused to drip down into an underlying collection part by heating the reaction tube inner surface to a temperature equal to or in excess of the melting point of silicon, the lower end portion of the reaction tube can be prevented from temperature lowering and therefore the silicon melt will not solidify at the lower end portion of the reaction tube.

The infrared device may comprise:

an infrared member comprising a carbon material, the infrared member being provided around the outer periphery of the reaction tube lower end portion away from the lower end portion; and the high frequency heating coil provided around the outer periphery of the infrared member so as to heat the infrared member.

That is, the infrared member is arranged around the outer periphery of the reaction tube lower end portion, and the high frequency heating coil is provided to heat both the silicon deposition region of the reaction tube and the infrared member. Consequently, the lower end portion of the reaction tube is heated sufficiently with the infrared rays from the infrared member and the temperature lowering in the lower end portion is prevented.

In another preferred embodiment, the temperature lowering prevention means is a lower end coil being constituted by a coil near the lower end of the high frequency heating coil and having an increased heating intensity relative to an upper coil.

The lower end coil can strongly heat the lower end portion of the reaction tube selectively so that when deposited silicon is caused to drip down into an underlying collection part by heating the reaction tube inner surface at a temperature equal to or in excess of the melting point of silicon, the lower end portion of the reaction tube can be prevented from temperature lowering and therefore the silicon melt will not solidify at the lower end portion of the reaction tube.

The lower end coil preferably has a smaller coil pitch than that of the upper coil.

The lower end coil wound at smaller pitches can selectively provide a higher heating intensity to the lower end portion of the reaction tube so that the reaction tube lower end portion can be prevented from temperature lowering.

The lower end coil preferably includes a plurality of coils wound into multiple layers expanding in a diameter direction.

The lower end coil consisting of multiwound coils can heat the lower end portion of the reaction tube such that high frequency waves from each of the multiwound coils heat the lower end portion of the reaction tube to provide a higher heating intensity selectively to the lower end portion so that the lower end portion can be prevented from temperature lowering.

The high frequency power of the lower end coil is preferably controllable separately from that of the upper coil.

That is, high frequency power is supplied to the lower end coil in a manner such that the high frequency power is supplied to the lower end coil from a separate power source from the upper coil, or in a manner such that the high frequency power is supplied to the lower end coil from a power source common to the upper coil and via a system such as a tap or a thyristor separately from the upper coil. Such control of the high frequency power for the lower end coil separately from the upper coil can selectively increase the heating intensity to the lower end portion of the reaction tube, so that the reaction tube lower end portion can be prevented from temperature lowering.

In the invention, a thermal insulating member may be provided around the outer periphery of the reaction tube to prevent heat release from the reaction tube.

The range of the lower end portion of the reaction tube may vary depending on the shape or the like. For example, the lower end portion may range up to intersections between:

straight lines extending from the intersection of a horizontal surface leveling with the lowermost end of the reaction tube and the central axis of the reaction tube, the straight lines each having an angle of 45 degrees relative to the horizontal surface; and perpendicular lines extending along the inner peripheral surface of the reaction tube in the axial direction, the perpendicular lines originating from the shortest straight line of the straight lines halving an opening shape of the reaction tube.

The silicon production apparatus according to the present invention enables that when deposited silicon is caused to drip down into the underlying collection part by heating the reaction tube inner surface at a temperature equal to or in excess of the melting point of silicon, the silicon melt can be prevented from solidifying at the lower end portion of the reaction tube due to temperature lowering at the lower end portion.

DETAILED DESCRIPTION OF THE INVENTION

Figure 1:
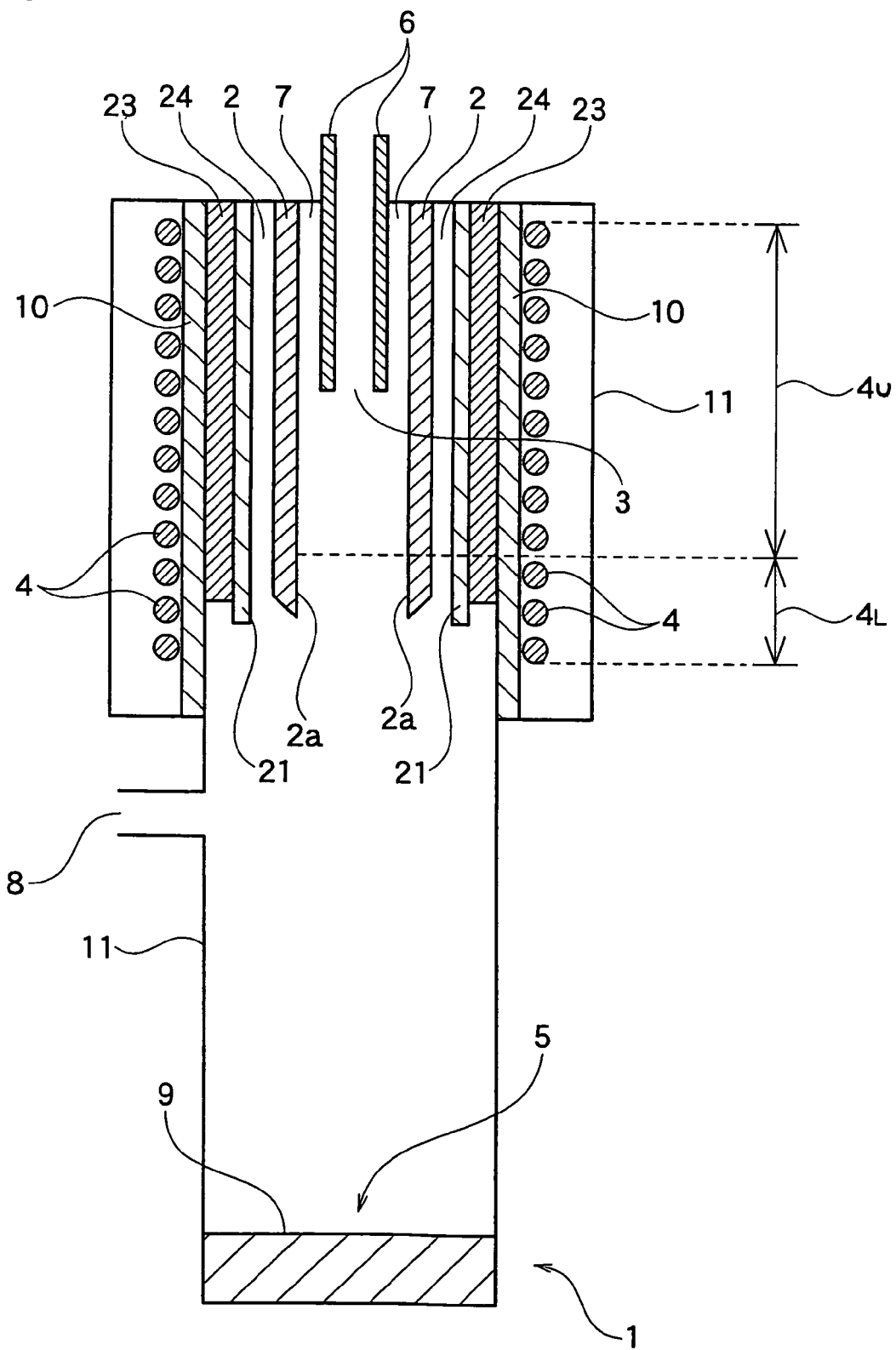
FIG. 1 is a sectional view showing an embodiment of a silicon production apparatus according to the present invention.

Hereinbelow, embodiments of the present invention will be described with reference to the drawings. FIG. 1 is a sectional view of an embodiment of the silicon production apparatus according to the invention. The members and items common to those of the aforesaid conventional silicon production apparatus will be indicated with smaller-by-hundred numbers.

As illustrated, a silicon production apparatus 1 has a closed vessel 11 that includes a reaction tube 2, a gas supply opening 3 for supplying a chlorosilane and hydrogen, a high frequency heating coil 4 provided around the outer periphery of the reaction tube 2, and a carbon tube 21 provided adjacent to the outer peripheral surface of the reaction tube 2, extending from an upper part to near a lower end portion 2a of the reaction tube.

The chlorosilanes for use in the reaction include trichlorosilane ($SiHCl_3$), silicon tetrachloride ($SiCl_4$), dichlorosilane ($SiH_2Cl_2$), monochlorosilane ($SiH_3Cl$), chlorodisilanes such as hexachlorodisilane ($Si_2Cl_6$), and chlorotrisilanes such as octachlorotrisilane ($Si_3Cl_8$). These chlorosilanes may be used singly or in combination of two or more kinds.

The reaction tube 2 is a cylindrical tube and is open downward at an opening in the lower end portion 2a. The reaction tube is suitably made of a carbon material such as graphite, which can undergo high frequency heating and is resistant to the melting point of silicon.

To enhance the durability of the reaction tube 2 and to improve the silicon purity, the inner tube surface that is brought into direct contact with deposited silicon is preferably coated with silicon nitride, silicon carbide or pyrolytic carbon which has a relatively high resistance to the silicon melt.

Into the reaction tube 2, the chlorosilane and hydrogen are supplied together or separately through the gas supply opening 3 of a gas supply tube 6 provided above. The gas supply tube 6 is preferably equipped with cooling means for cooling the gas supply tube 6 to prevent thermal deterioration of the tube and to prevent the chlorosilane from decomposing within the tube. For example, the cooling of the gas supply tube 6 may be performed as follows. The gas supply tube 6 is fitted with a channel in which a refrigerant liquid such as water or heat transfer oil is circulated for cooling (fluid jacket system). Alternatively, one or more nozzles are arranged around the outer periphery of the gas supply tube 6 in a substantially concentric configuration, and the reaction gas is supplied through the gas supply tube 6 and simultaneously the gas supply tube 6 is cooled by feeding (purging) a cooling gas into the gap between the gas supply tube 6 and the nozzles (air cooling jacket system).

The inner surface of the reaction tube 2 and the outer surface of the gas supply tube 6 are laterally superposed on one another in an upper region of the reaction tube 2. Since this region is a low temperature region, it is difficult to melt the solid silicon deposited in this region by heating to a temperature equal to or in excess of its melting point. Therefore, a seal gas such as hydrogen or argon gas is supplied to a gap 7 between the reaction tube 2 and the gas supply tube 6 to fill the gap 7 with the seal gas atmosphere, thereby preventing the chlorosilane/hydrogen mixed gas from filling the gap 7. Alternatively, a reagent such as hydrogen chloride that produces a feedstock gas by reaction with silicon may be supplied to the gap 7 singly or in combination with the seal gas.

Other regions in the production apparatus 1 where the silicon deposition should be avoided, such as a gap 24 between the reaction tube 2 and the carbon tube 21, are similarly filled with a seal gas or the like.

The reaction tube 2 is heated with an electromagnetic wave (high frequency wave) from the peripherally-provided high frequency heating coil 4, and the inner surface of the reaction tube 2 is brought to a temperature equal to or in excess of the melting point of silicon or to a temperature below the melting point at which silicon deposition is feasible. The heating region generally ranges from the lower end portion 2a to a length in the tube direction that is 30 to 90% of the total length of the reaction tube 2 in the closed vessel 11.

When the silicon deposition is performed while the inner surface of the reaction tube 2 has a temperature equal to or in excess of the melting point of silicon (first method), the inner surface of the reaction tube 2 is brought to or above the melting point of silicon (generally from 1410 to 1430° C.) and the silicon is deposited in a molten state.

When the silicon deposition is performed while the inner surface of the reaction tube 2 has a temperature below the melting point at which silicon deposition is feasible (second method), the temperature of the inner surface of the reaction tube 2 will be 950° C. or above, preferably 1200° C. or above, and more preferably 1300° C. or above.

The high frequency heating coil 4 generates an electromagnetic wave to heat the reaction tube 2 by the passage of electric current through the coil 4 from a power source (not shown). The frequency of the electromagnetic wave is determined appropriately depending on the material or shape of the heating object such as the heating tube 2. For example, the frequency is set at approximately several tens of Hz to several tens of GHz.

The silicon deposited on the inner surface of the reaction tube 2 is caused to drip down from an opening at the lower end portion 2a of the reaction tube 2, and is collected in a silicon collection part 5 provided underneath.

The silicon collection part 5 has a cooling collection part made of such a material as a metal, ceramic or glass. To achieve toughness as industrial equipment and to collect high purity silicon, it is preferable that the inner surface of the metal cooling collection part is lined with silicon, Teflon (trade name), quartz glass, tantalum, tungsten or molybdenum. It is also appropriate to cover the upper bottom surface of the cooling collection part with silicon particles. Further, a withdrawal opening may be provided to permit continual or intermittent withdrawal of the solidified silicon from the cooling collection part. The silicon that has reached the cooling collection part is cooled by contact with the aforesaid material. Alternatively, the cooling may be conducted by providing a cooling jacket in which a refrigerant liquid is circulated, or a cooling gas supply tube for supplying a cooling gas.

In the aforesaid first method, the silicon melt deposited in a molten state is allowed to continually drip down from the opening at the lower end portion 2a of the reaction tube 2 and is collected in the silicon collection part 5 provided underneath. In this case, the deposited silicon melt flows downward on the inner surface of the reaction tube 2 and drips down by gravity from the lower end portion 2a. The drops solidify during or after the gravity fall.

In the second method, the solid silicon is temporarily deposited on the inner surface of the reaction tube 2 and the inner surface is heated to a temperature equal to or in excess of the silicon melting point, so that part or whole of the deposit is molten and is caused to drip down into the silicon collection part 5 provided underneath, in which the silicon is collected.

This method repeats the step of depositing silicon on the inner surface of the reaction tube 2 and the step of heating the inner surface to a temperature equal to or in excess of the melting point of silicon to drop the deposit and collect it in the silicon collection part 5. In the withdrawal of the silicon 9 from the collection part 5 to outside the apparatus, a plate-like member may be provided such that it is laterally slidable so as to partition the inside of the apparatus into an upper space including the reaction tube 2 and a lower space including the collection part 5. According to this configuration, the deposition reaction can be continually performed while maintaining the reaction gas atmosphere in the upper space of the apparatus, and the silicon 9 collected in the collection part 5 can be withdrawn to outside the apparatus. Meanwhile, the heating of the inner surface of the reaction tube 2 to or above the melting point of silicon may be accomplished by manipulating the power output of the high frequency heating coil 4. Alternatively, the heating can be accomplished by reducing the flow rate of the gas flowing in the silicon production apparatus 1.

There is particularly no limitation on silicon production conditions. Preferably, conditions such as the chlorosilane/hydrogen feed ratio, feed rate and dwell time are determined such that the chlorosilane-to-silicon conversion will be at least 20%, and preferably at least 30%. To achieve an efficient production rate of silicon relative to the reaction apparatus size, the molar fraction of the chlorosilane to the gas supplied is preferably in the range of 0.1 to 99.9 mol %, and more preferably 5 to 50 mol %. Although the higher the reaction pressure, the more downsized the apparatus, the pressure will range from about 0 to 1 MPaG because of easy industrial implementation.

The gas dwell time may vary depending on the pressure and temperature conditions with a specific-volume reaction apparatus. Under the reaction conditions, the average dwell time of the gas in the reaction tube 2 will be in the range of 0.001 to 60 seconds, and preferably 0.01 to 10 seconds, in which case a sufficiently efficient conversion of the chlorosilane can be achieved.

When the inner surface of the reaction tube 2 is heated by the high frequency heating coil 4 to or above the melting point of silicon to cause the silicon to drip down from the lower end portion 2a of the reaction tube 2 and to collect it in the silicon collection part 5, the lower end portion 2a has particularly great heat release and thus cannot be heated sufficiently, resulting in a lower temperature relative to the upper inner surface of the tube. Consequently, the silicon melt is cooled at the lower end portion 2a and is partially solidified.

The solidification of the silicon melt at the lower end portion 2a results in growth of a silicon mass hanging like an icicle from the tip of the lower end portion 2a. Thus, the silicon melt cannot be dropped and collected in the silicon collection part 5 appropriately.

To solve this problem, the present invention provides temperature lowering prevention means for preventing temperature lowering in the lower end portion 2a when the reaction tube 2 is heated to or above the melting point of silicon. Specifically, the temperature lowering prevention means is a device or a member capable of heating the lower end portion 2a such that the lower end portion 2a has a temperature equal to or in excess of the silicon melting point, preferably 1430 to 1500° C. The lower end portion 2a should be prevented from being overheated with the temperature lowering prevention means because otherwise undesirable silicon fine powder will result.

Figure 9:
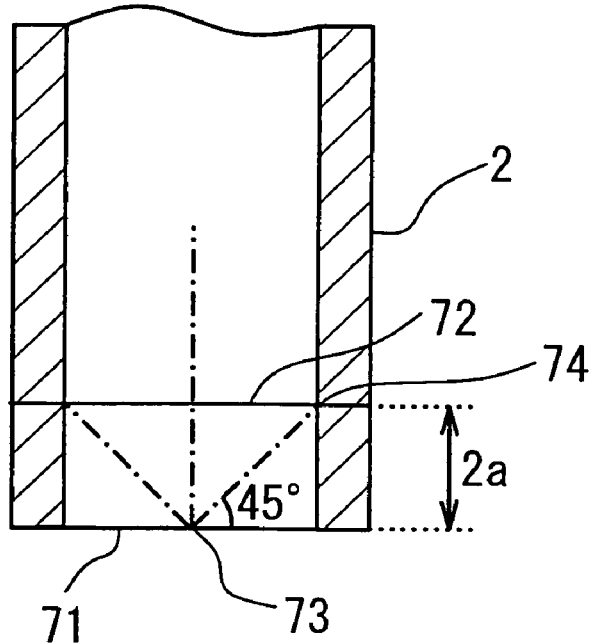
FIGS. 9(a)-9(b) are a set of fragmentary views of the reaction tube for explaining the range of the reaction tube lower end portion to be heated with temperature lowering prevention means.
Figure 9:
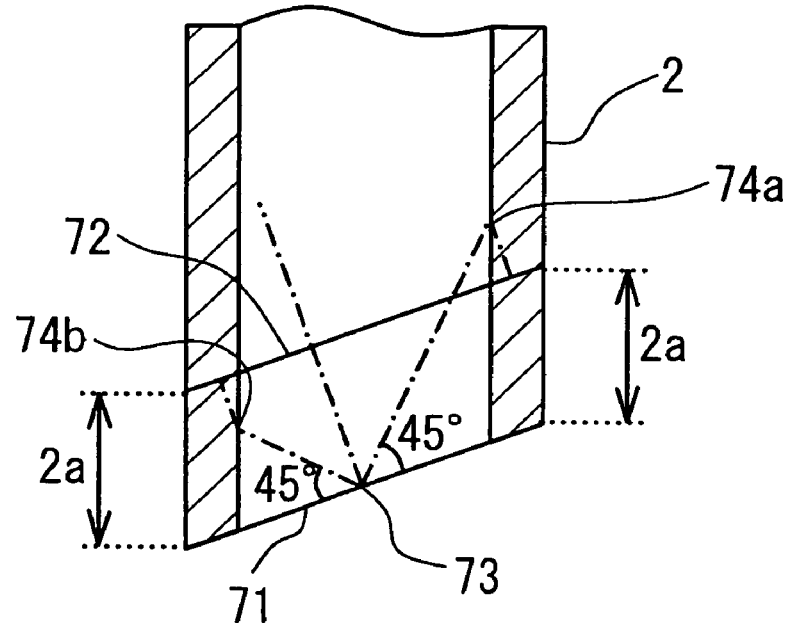

The range of the lower end portion 2a to be heated with the temperature lowering prevention means may vary depending on its shape or the like. For example, as illustrated in FIG. 9(a), the lower end portion 2a to be heated with the temperature lowering prevention means will range up to a horizontal surface 72 passing through intersections 74 between:

straight lines extending from an intersection 73 of a horizontal surface (opening surface) 71 leveling with the lowermost end of the reaction tube 2 and the central axis of the reaction tube 2, the straight lines each having an angle of 45 degrees relative to the opening surface 71; and perpendicular lines extending along the inner peripheral surface of the reaction tube 2 in the axial direction, the perpendicular lines originating from the shortest straight line of the straight lines halving the opening surface 71 (for example, when the opening surface 71 has an elliptical shape, the shortest straight line is the minor axis). The larger the opening diameter of the reaction tube 2, the greater the heat release from the lower end portion 2a, so that the lower end portion 2a to be heated is extended.

The opening shape of the reaction tube 2 may be a circular shape or other shape such as an elliptical shape. The lower end portion 2a in the vicinity of the opening may have a uniform thickness from above to the lowermost end. In another embodiment, to control the droplet of the silicon melt such that the silicon particles have small and uniform diameters, the outer peripheral portion may be tapered such that the diameter is gradually reduced toward the lowermost end. Furthermore, the peripheral edge of the opening may have a wavy form.

The opening surface of the reaction tube 2 may be tilted relative to the horizontal level. In this case, as illustrated in FIG. 9(b), the lower end portion 2a to be heated with the temperature lowering prevention means will range up to a surface 72 that is parallel to an opening surface 71 and has identical distances from intersections 74a and 74b between:

straight lines extending from an intersection 73 of the opening surface 71 of the reaction tube 2 and the central axis of the reaction tube 2, the straight lines each having an angle of 45 degrees relative to the opening surface 71; and perpendicular lines extending along the inner peripheral surface of the reaction tube 2 in the axial direction, the perpendicular lines originating from the shortest straight line of the straight lines halving the opening surface 71.

The height of the lower end portion 2a to be heated can be generally determined based on the FIGS. 9(a) and (b) even when the lower end portion 2a of the reaction tube 2 has a complicated form.

Figure 10:
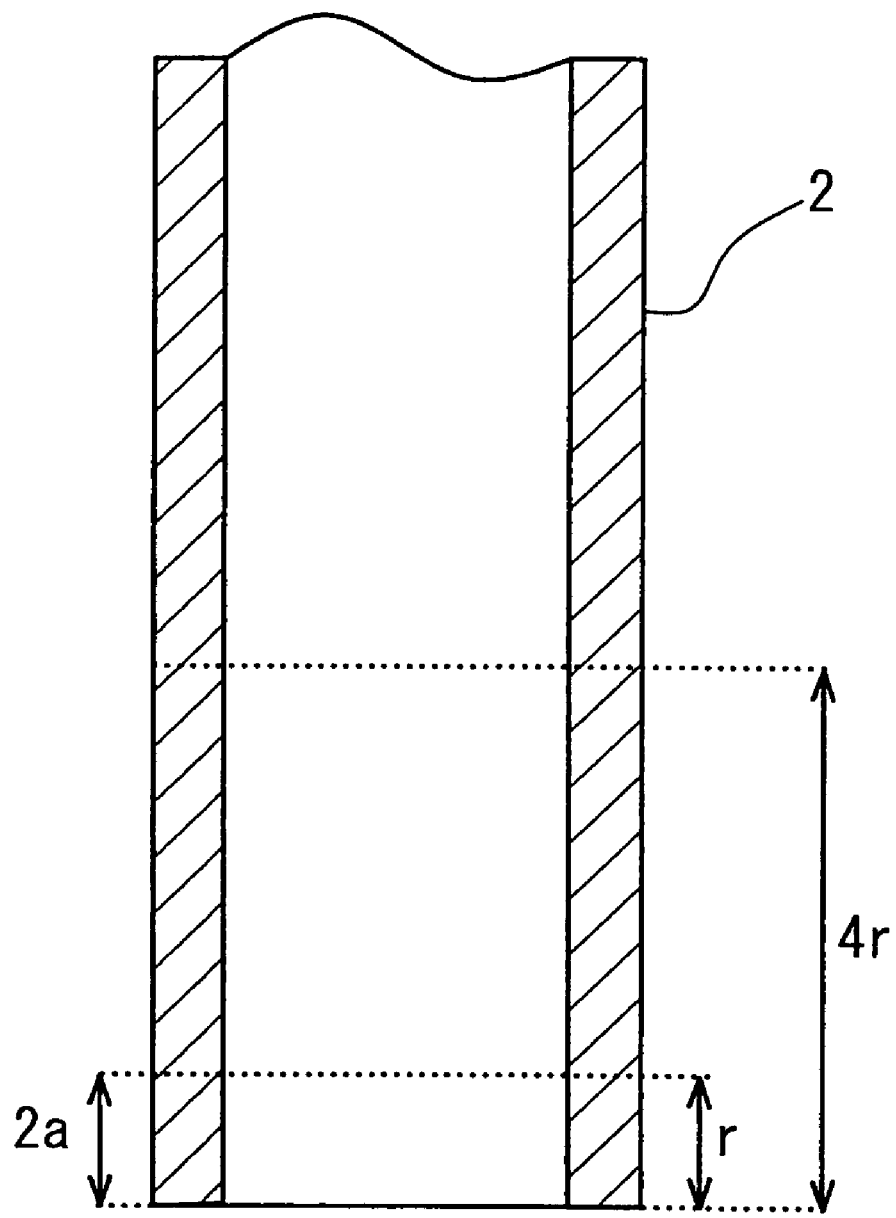
FIG. 10 is a fragmentary view of the reaction tube for explaining a region to be heated with the temperature lowering prevention means.

It is necessary that the temperature lowering prevention means heats a region that covers the lower end portion 2a (portion from the lowermost end of the reaction tube 2 to a distance r in the tube axial direction), as shown in FIG. 10.

The heating region is desirably extended as required to a length 4 times the distance r (distance 4r). When the reaction tube 2 is heated with the temperature lowering prevention means to a length exceeding the distance 4r, silicon fine powder often results.

Figure 11:
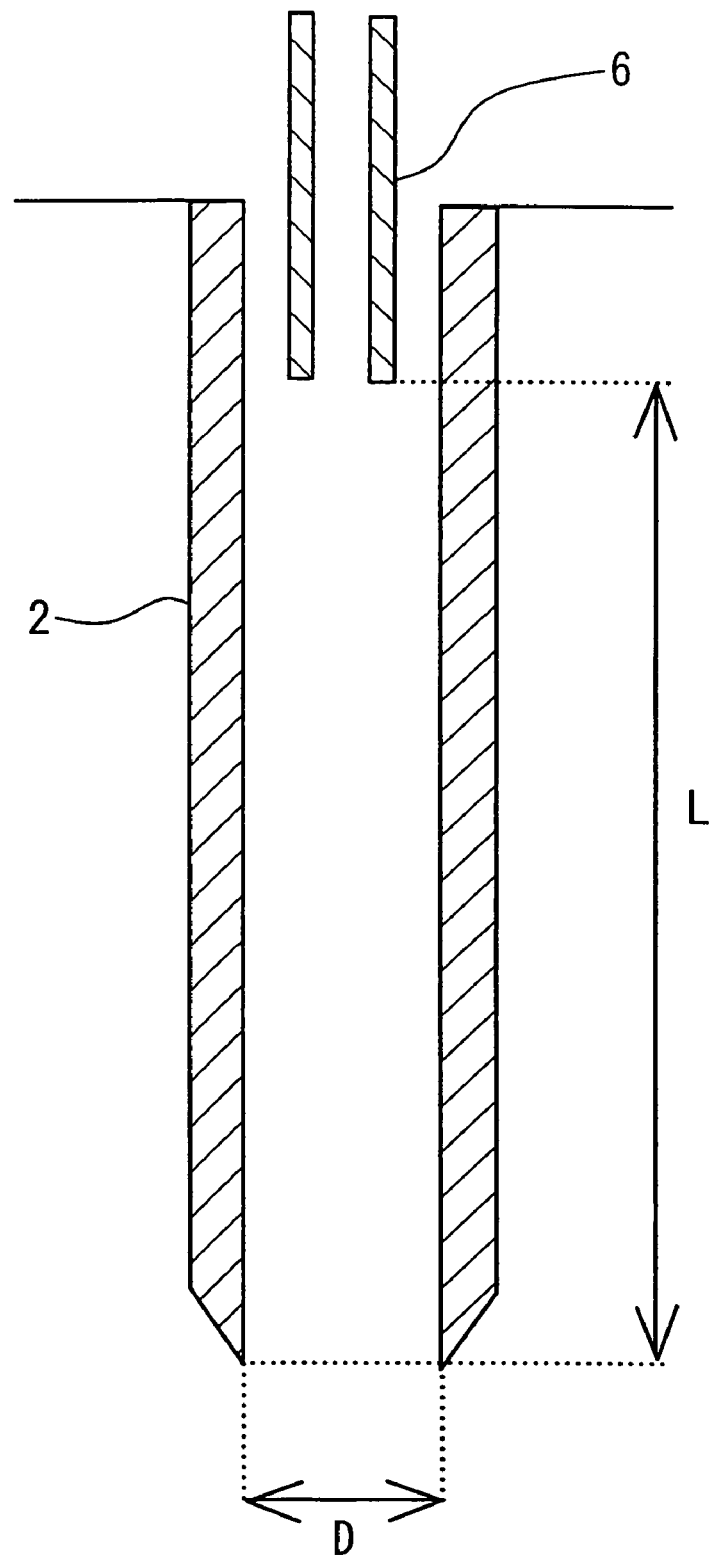
FIG. 11 is a sectional view of the reaction tube for explaining a ratio L/D of a length L of a silicon deposition section of the reaction tube to an inner diameter D of the reaction tube at the lowermost end.
Figure 12:
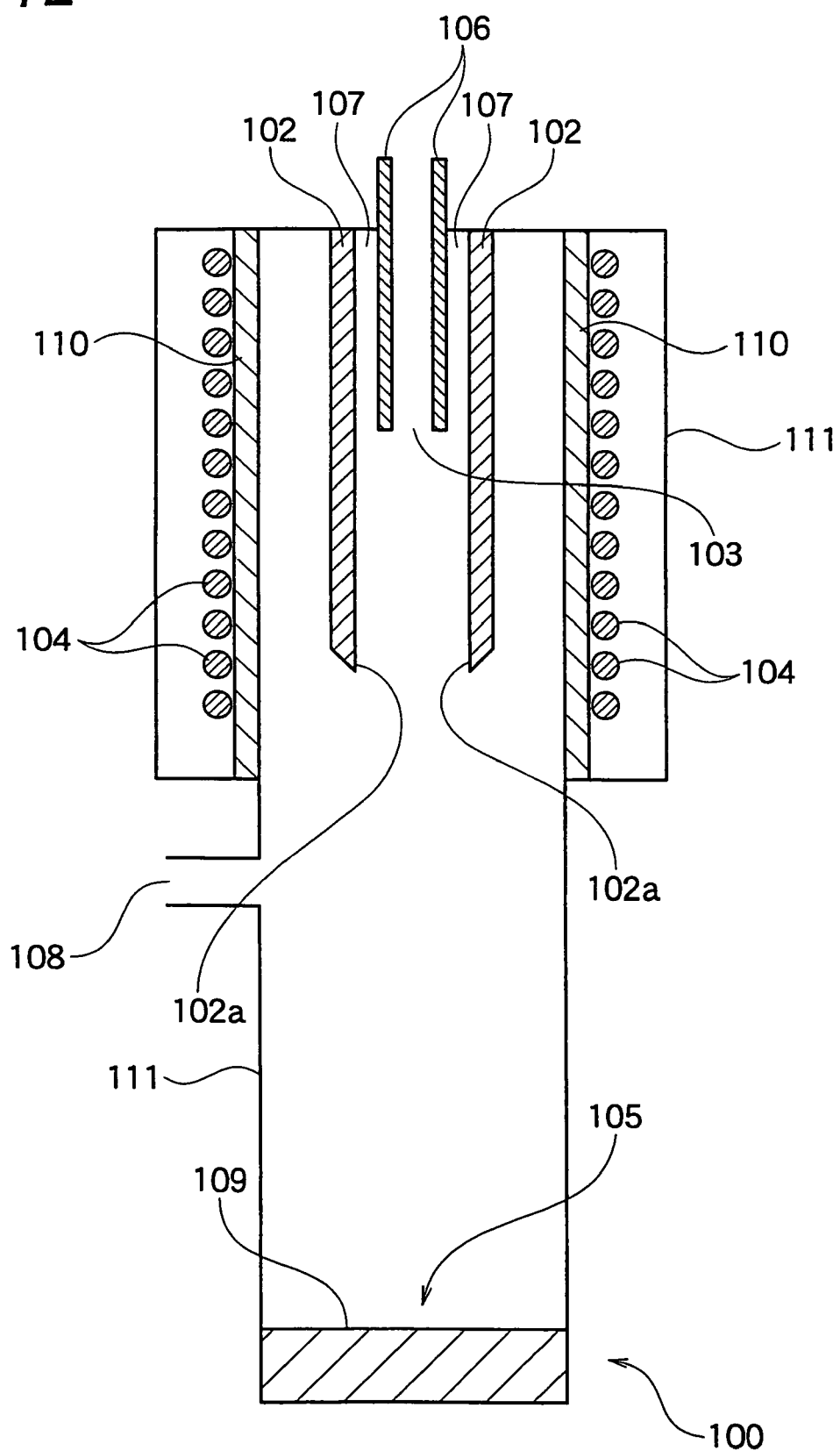
FIG. 12 is a sectional view showing a conventional silicon production apparatus.

In the apparatus of the present invention, a section of the reaction tube 2 in which silicon is deposited (silicon deposition section) has a length L (see FIG. 11) such that the ratio (L/D) of the length L to an inner diameter D of the reaction tube 2 at the lowermost end is at least 2, and preferably at least 3.

In a preferred embodiment, the apparatus includes a thermal insulating member 23 that is provided around the outer periphery of the reaction tube 2 to prevent the heat release from the reaction tube 2 during heating. The provision of the thermal insulating member is not compulsory, and may be omitted depending on the case. Even when the thermal insulating member 23 covers the reaction tube 2 to the lowermost end of the lower end portion 2a, the temperature lowering at the lower end portion 2a occurs due to the heat release from the inner surface of the lower end portion 2a. The temperature lowering at the lower end portion 2a will be more significant if the thermal insulating member 23 does not cover the reaction tube 2 to the lower end portion 2a.

In the embodiment shown in FIG. 1, the temperature lowering at the lower end portion 2a is prevented by providing a carbon tube 21 that is adjacent to the lower end portion 2a while surrounding the outer periphery thereof. The carbon tube 21 is mainly made of a carbon material, such as graphite, that can be heated with high frequency waves from the high frequency heating coil 4.

The lower end portion 2a of the reaction tube 2 is heated directly by the high frequency heating coil 4 and simultaneously with the infrared rays from the carbon tube 21 that is heated by the high frequency heating coil 4.

Because of the additional heating with the infrared rays from the carbon tube 21, the lower end portion 2a can be heated sufficiently to a temperature equal to or above the melting point of silicon. Accordingly, the silicon melt will not be cooled in this portion to cause a silicon mass, and the silicon melt can flow on the inner surface of the reaction tube 2 and smoothly drip down from the lower end portion 2a into the silicon collection part 5.

In the present embodiment, the carbon tube 21 is provided in between the reaction tube 2 and the peripherally-provided thermal insulating member 23 made of carbon fibers or sintered ceramic, such that the thermal insulating member 23 is wound around the outer peripheral surface of the carbon tube 21. The gap 24 between the reaction tube 2 and the carbon tube 21 is filled with a seal gas such as hydrogen to prevent the deposition of silicon in this region. In this case, the tubular member such as the carbon tube 21 that is interposed between the reaction tube 2 and the thermal insulating member 23 may be formed such that a part thereof including a lower end portion is made of a carbon material and the remaining upper part is made of a material, such as a ceramic, that is not heated with the high frequency wave from the high frequency heating coil 4. That is, the infrared heating of the lower end portion 2a can be performed properly if the tubular member in the vicinity of the lower end portion 2a of the reaction tube 2 is made of a carbon material, and the remaining part of the tubular member may be made of a material other than the carbon material.

Figure 2:
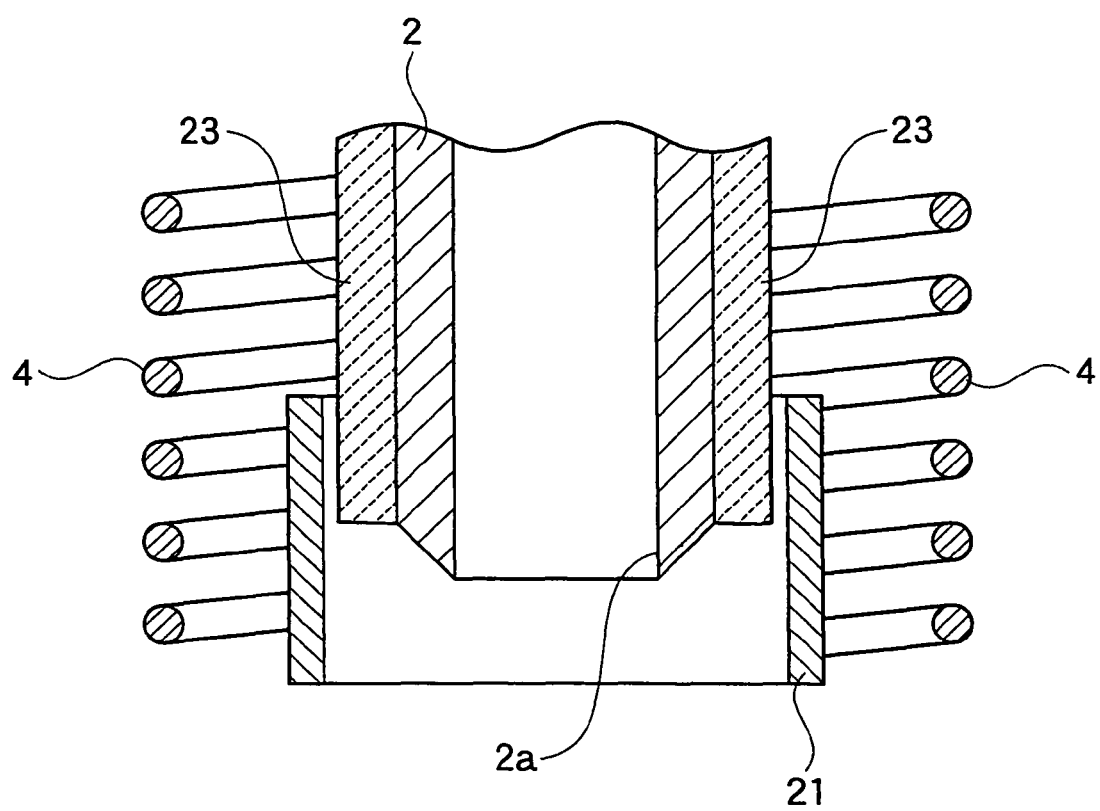
FIG. 2 is a fragmentary sectional view showing the vicinity of a reaction tube lower end portion in a modification of the FIG. 1 embodiment.

In another embodiment, as illustrated in FIG. 2, the thermal insulating member 23 may be wound around the outer periphery of the reaction tube 2, and the carbon tube 21 may be provided only in the vicinity of the lower end portion 2a of the reaction tube 2. To permit the high frequency wave from the high frequency heating coil 4 to effectively reach the lower end portion 2a of the reaction tube 2, the thickness in the diameter direction of the carbon tube 21 is desirably small without deteriorating the strength and the like in view of the penetration depth depending on the frequency.

Figure 3:
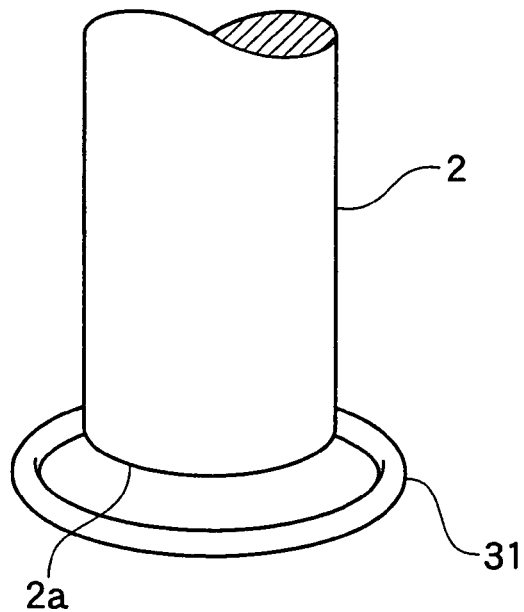
FIG. 3 is a perspective view showing the vicinity of a reaction tube lower end portion in another embodiment of the silicon production apparatus.
Figure 4:
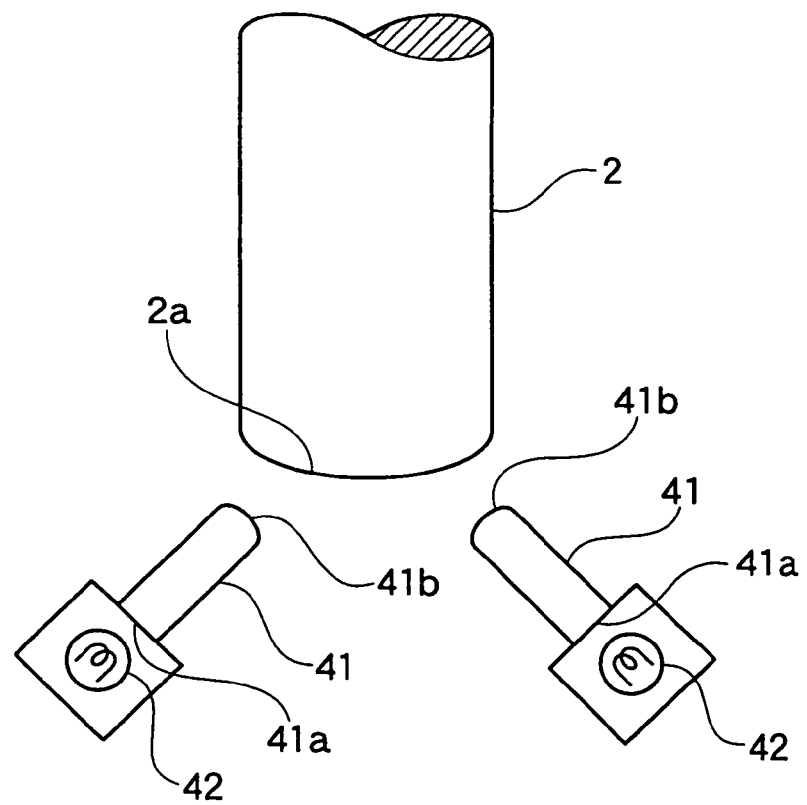
FIG. 4 is a perspective view showing the vicinity of a reaction tube lower end portion in another embodiment of the silicon production apparatus.

FIGS. 3 and 4 are views showing the vicinity of the reaction tube lower end portion in other embodiments of the silicon production apparatus of the present invention. In the FIG. 3 embodiment, a ring-shaped heating unit 31 is arranged in the vicinity of the lower end portion 2a of the reaction tube 2. An electric current is supplied to the ring-shaped heating unit 31 from a power source (not shown), and the ring-shaped heating unit 31 is energized and radiates infrared rays to the lower end portion 2a to heat the same.

In the FIG. 4 embodiment, a plurality of rod-shaped members 41 made of quartz glass are arranged in the vicinity of the lower end portion 2a of the reaction tube 2. The infrared light from an electric bulb 42 is introduced into the rod-shaped member 41 from a rear end portion 41a thereof and is guided to a front end portion 41b. The infrared light having reached the front end portion 41b is spot applied to the lower end portion 2a to heat the same. The front end portion 41b of the rod-shaped quartz glass member 41 is desirably formed like a lens to focus the infrared light.

The aforesaid embodiments employ infrared rays to heat the lower end portion 2a of the reaction tube 2 to prevent the temperature lowering. Preferably, the infrared rays are applied to the entire peripheral surface of the lower end portion 2a.

Figure 5:
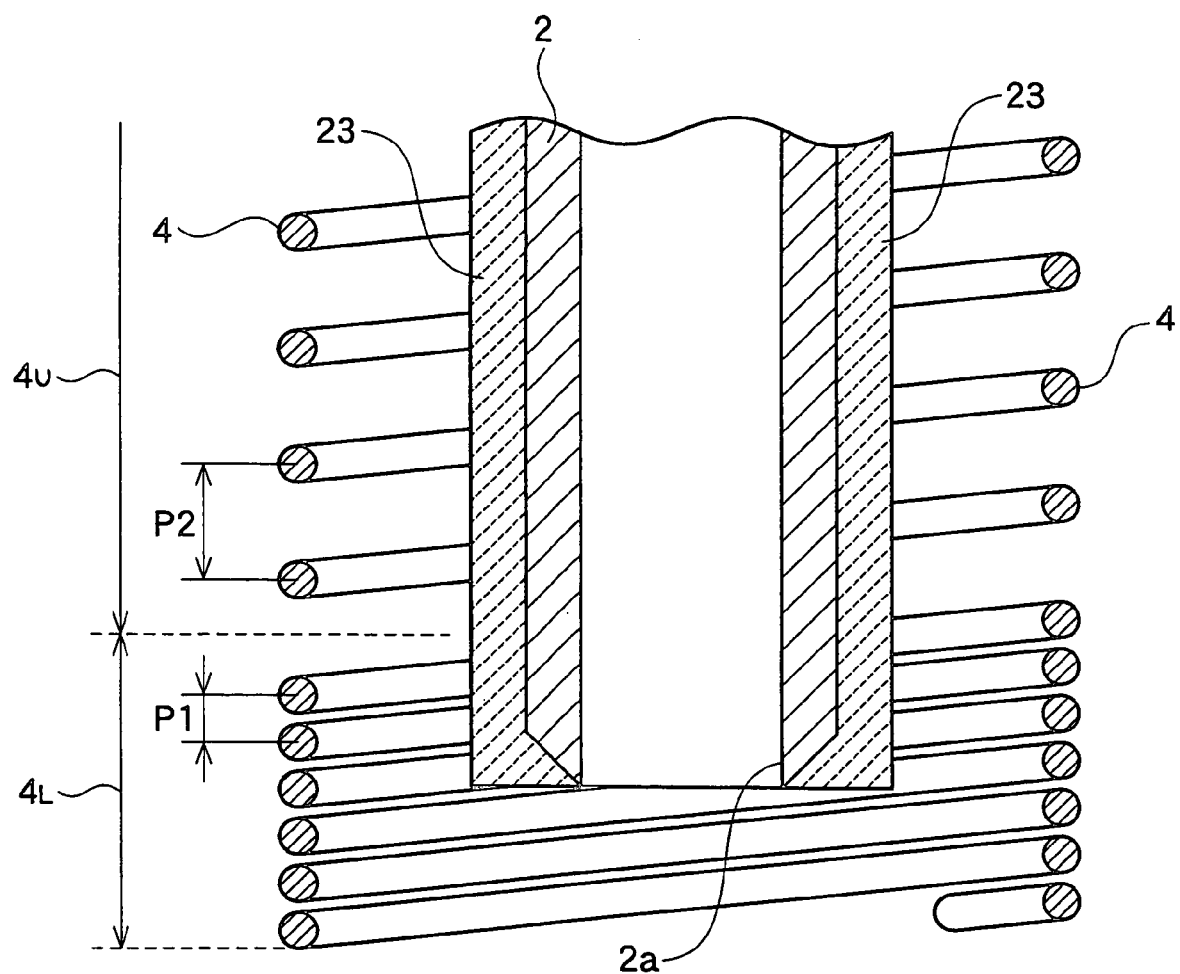
FIG. 5 is a fragmentary sectional view showing the vicinity of a reaction tube lower end portion in another embodiment of the silicon production apparatus.

FIG. 5 is a sectional view showing the vicinity of the reaction tube lower end portion in another embodiment of the silicon production apparatus. In the present embodiment, the high frequency heating coil 4 is formed such that a coil (lower end coil 4L) near the lower end portion 2a of the reaction tube 2 has smaller coil pitches P1 than coil pitches P2 of an upper coil 4U. (Refer to FIG. 1 for the arrangement of the lower end coil 4L and coil 4U.)

When the lower end coil 4L has an increased winding density as described above, the high frequency heating coil 4 can heat the reaction tube 2 such that the lower end portion 2a is strongly heated selectively by the lower end coil 4L having a high winding density, and the temperature lowering at the lower end portion 2a is prevented.

The high frequency heating coil 4 is supplied with electricity from a single power source. When electricity is supplied to the high frequency heating coil 4 from one end to the other in which the coil consists of the lower end coil 4L and the upper coil 4U with different winding densities, the lower end coil 4L having smaller coil pitches emits a high frequency wave with a higher intensity than that from the upper coil 4U. Accordingly, the lower end portion 2a of the reaction tube 2 is strongly heated selectively. Since the heating of the lower end portion 2a and upper portion of the reaction tube 2 can be performed with a single power source, the apparatus structure can be relatively simplified.

In view of prevention of silicon mass formation at the lower end portion 2a of the reaction tube 2, the coil pitches P1 and P2 of the lower end coil 4L and upper coil 4U preferably have a coil pitch ratio P2/P1 of at least 3, although dependent on the apparatus structure.

Figure 6:
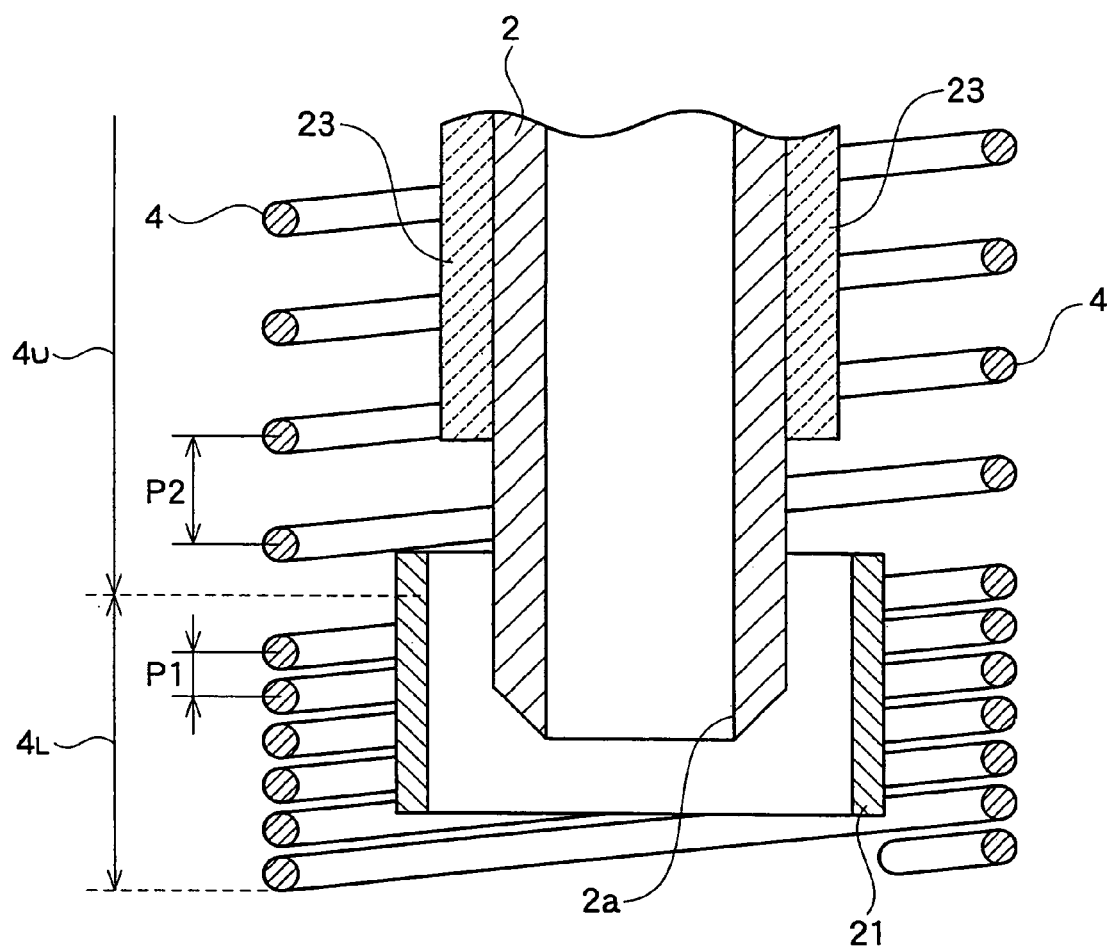
FIG. 6 is a fragmentary sectional view showing the vicinity of a reaction tube lower end portion in a modification of the FIG. 5 embodiment.

FIG. 6 is a sectional view of a modification of the FIG. 5 embodiment. As illustrated, the carbon tube 21 is provided in the vicinity of the lower end portion 2a of the reaction tube 2. The carbon tube 21 is heated by the lower end coil 4L having a high winding density and emits infrared rays to heat the lower end portion 2a of the reaction tube 2.

The lower end portion 2a of the reaction tube 2 is strongly heated selectively by the lower end coil 4L having a high winding density. In addition, the lower end portion is heated with the infrared rays from the carbon tube 21 heated with the high frequency wave from the lower end coil 4L. Accordingly, the temperature lowering at the lower end portion 2a of the reaction tube 2 can be effectively prevented.

Figure 7:
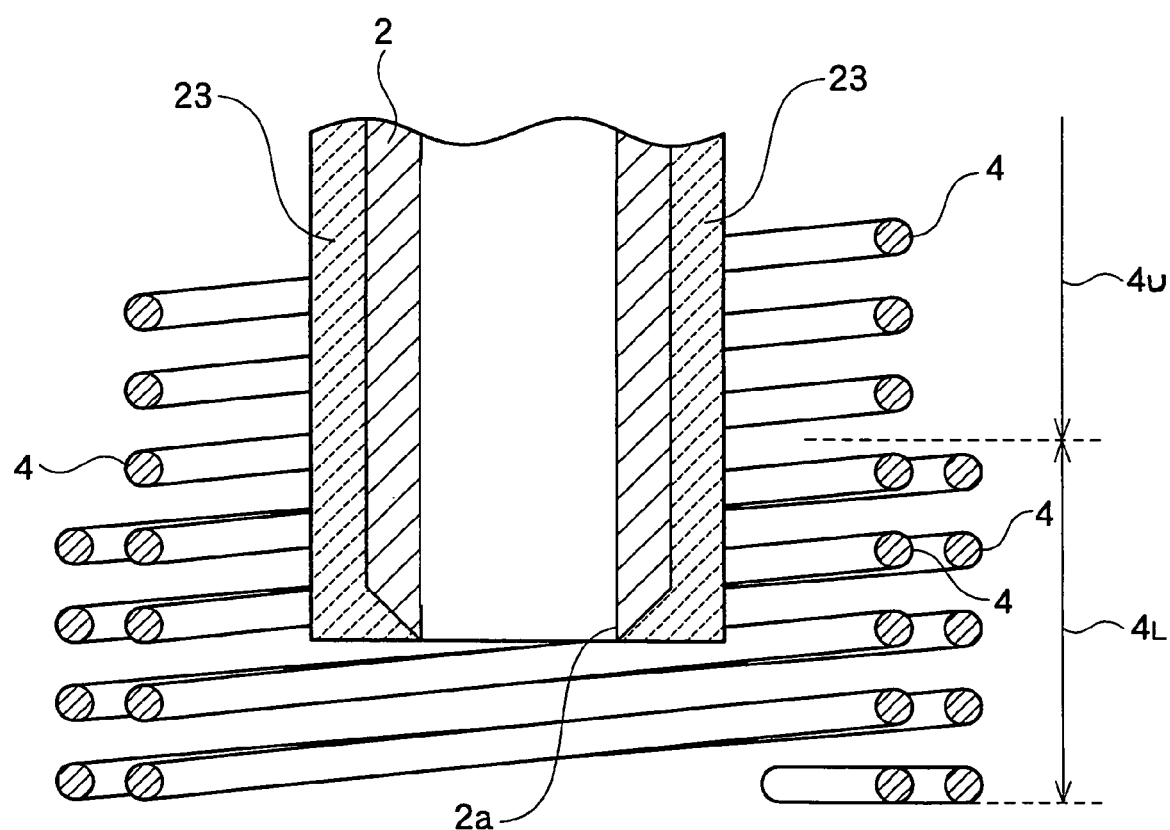
FIG. 7 is a fragmentary sectional view showing the vicinity of a reaction tube lower end portion in another embodiment of the silicon production apparatus.

FIG. 7 is a sectional view showing the vicinity of the reaction tube lower end portion in another embodiment of the silicon production apparatus. In the present embodiment, the high frequency heating coil 4 near the lower end portion 2a of the reaction tube 2 includes two coils (lower end coils 4L) that are double wound in the diameter expanding direction.

When the reaction tube 2 is heated by the high frequency heating coil 4, the double-wound lower end coils 4L can heat the lower end portion 2a of the reaction tube 2 by means of the high frequency waves from both the inner and outer coils of the lower end coils 4L. Accordingly, the heating can be performed more strongly than by the upper coil 4U. Thus, the lower end portion 2a of the reaction tube 2 is strongly heated selectively, and the temperature lowering at the lower end portion 2a is prevented.

The double-wound lower end coils 4L may be multilayer coils wound at least threefold in the diameter expanding direction.

When the lower end coil 4L is created by winding a single coil into multilayer coils, the high frequency heating coil 4 may be supplied with electricity from a single power source.

Figure 8:
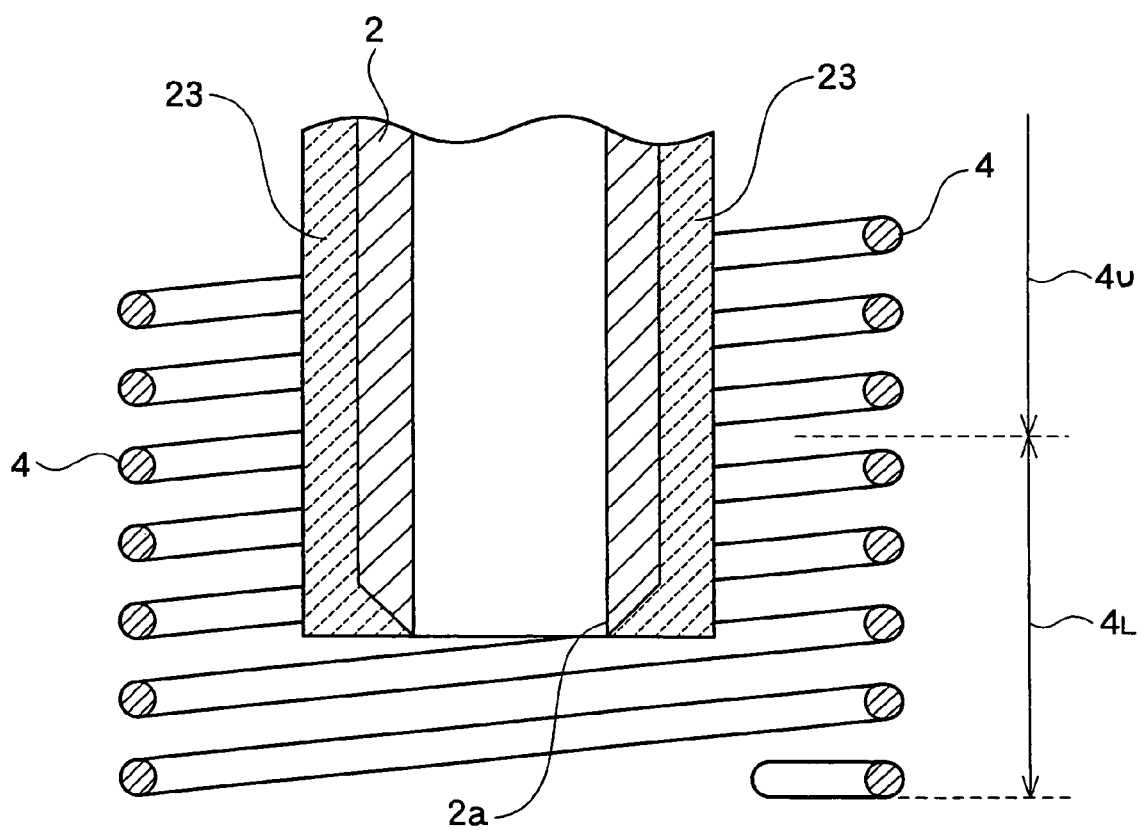
FIG. 8 is a fragmentary sectional view showing the vicinity of a reaction tube lower end portion in another embodiment of the silicon production apparatus.

FIG. 8 is a sectional view showing the vicinity of the reaction tube lower end portion in another embodiment of the silicon production apparatus. In the present embodiment, the high frequency heating coil 4 consists of two individual coils supplied with electricity from separate systems.

One coil 4U is arranged around the outer periphery of the entire deposition section above the vicinity of the lower end portion 2a of the reaction tube 2, and the other lower end coil 4L is arranged in the vicinity of the lower end portion 2a of the reaction tube 2.

The coil 4U and the lower end coil 4L are controlled by separate independent control systems to provide appropriate high frequency power. The coil 4U heats the deposition section above the lower end portion 2a of the reaction tube 2, and the coil 4L heats the lower end portion 2a.

When the silicon is molten, the high frequency power is controlled by the control systems such that the lower end coil 4L heats the lower end portion 2a of the reaction tube 2 with a higher heating intensity than the upper coil 4L heats the reaction tube 2. This control permits the lower end portion 2a of the reaction tube 2 to be selectively heated strongly with the strong high frequency wave from the lower end coil 4L, so that the temperature lowering at the lower end portion 2a is prevented.

To control the high frequency power of the coil 4U and that of the lower end coil 4L separately by independent systems, separate power sources will be provided to supply electricity to the coil 4U and the lower end coil 4L, and the coils will be provided with high frequency power from the respective power source.

Alternatively, the coil 4U and the lower end coil 4L can be supplied with electricity from a single power source, and independent power supply systems can be established with a tap or a thyristor to provide the coils with high frequency power from separate systems.

The supply of high frequency power to the lower end coil 4L is feedback controlled by measuring the temperature of the lower end portion 2a of the reaction tube 2, or is manipulated while visually observing the operation state.

The present invention will be described hereinbelow by examples, but is not limited to the examples.

Example 1

A carbon-made cylindrical reaction tube 100 mm in outer diameter, 70 mm in inner diameter and 1000 mm in length was fitted in a polycrystalline silicon production apparatus. Around the outer periphery of a lower end portion of the reaction tube was arranged a carbon tube (21) as shown in FIG. 2, so that the reaction tube lower end portion would be heated with infrared rays from the carbon tube heated by a high frequency heating coil.

A mixed gas was fed into the reaction tube at rates of 20 kg/h for trichlorosilane and 40 $Nm^3$/h for hydrogen. The high frequency heating coil wound at regular pitches was energized to heat the lower end portion and remaining upper portion of the reaction tube to a temperature of 1450° C. or above, and polycrystalline silicon was deposited in a molten state. After the reaction had been performed continually for 100 hours, the lower end portion of the reaction tube was visually observed, but no silicon mass had been solidified at the lower end portion of the reaction tube.

Example 2

A carbon-made cylindrical reaction tube 100 mm in outer diameter, 70 mm in inner diameter and 1000 mm in length was fitted in a polycrystalline silicon production apparatus. The silicon production apparatus included a high frequency heating coil in which a lower end coil (4L) had smaller pitches and a higher winding density, as illustrated in FIG. 5. The pitch P1 of the lower end coil (4L) was 10 mm, and the pitch P2 of the upper coil (4U) was 30 mm. This continually wound coil was supplied with high frequency power from a single power source.

A mixed gas was fed into the reaction tube at rates of 20 kg/h for trichlorosilane and 40 $Nm^3$/h for hydrogen. The high frequency heating coil was energized to heat the lower end portion and remaining upper portion of the reaction tube to a temperature of 1450° C. or above, and polycrystalline silicon was deposited in a molten state. After the reaction had been performed continually for 100 hours, the lower end portion of the reaction tube was visually observed, but no silicon mass had been solidified at the lower end portion of the reaction tube.

Example 3

A carbon-made cylindrical reaction tube 100 mm in outer diameter, 70 mm in inner diameter and 1000 mm in length was fitted in a polycrystalline silicon production apparatus. The silicon production apparatus included a high frequency heating coil in which a lower end coil (4L) was double wound in the diameter extending direction, as illustrated in FIG. 7.

A mixed gas was fed into the reaction tube at rates of 20 kg/h for trichlorosilane and 40 $Nm^3$/h for hydrogen. The high frequency heating coil was energized to heat the lower end portion and remaining upper portion of the reaction tube to a temperature of 1450° C. or above, and polycrystalline silicon was deposited in a molten state. After the reaction had been performed continually for 100 hours, the lower end portion of the reaction tube was visually observed, but no silicon mass had been solidified at the lower end portion of the reaction tube.

Example 4

A carbon-made cylindrical reaction tube 100 mm in outer diameter, 70 mm in inner diameter and 1000 mm in length was fitted in a polycrystalline silicon production apparatus. The silicon production apparatus included a high frequency heating coil in which the high frequency power for a lower end coil (4L) and an upper coil (4U) was separately controlled by respective systems, as illustrated in FIG. 8. That is, the lower end coil (4L) and the upper coil (4U) had separate power sources, and the power supply to the separate coils was controlled independently.

A mixed gas was fed into the reaction tube at rates of 20 kg/h for trichlorosilane and 40 Nm$^3$/h for hydrogen. The high frequency heating coil was energized to heat the lower end portion and remaining upper portion of the reaction tube to a temperature of 1450° C. or above, and polycrystalline silicon was deposited in a molten state. After the reaction had been performed continually for 100 hours, the lower end portion of the reaction tube was visually observed, but no silicon mass had been solidified at the lower end portion of the reaction tube.

COMPARATIVE EXAMPLE 1

The reaction was carried out continually under the same conditions as in Example 1, except that the carbon tube (21) was eliminated. The reaction resulted in solidification of a silicon mass at the lower end portion of the reaction tube, and the silicon had grown like an icicle. The silicon mass prevented continuation of the reaction.

The invention claimed is:

1. A polycrystalline silicon production apparatus comprising:
   a reaction tube comprising a carbon material;
   a gas supply opening through which a chlorosilane and hydrogen are supplied from above the reaction tube; and
   a high frequency heating coil provided around the outer periphery of the reaction tube, wherein the high frequency heating coil heats at least part of the reaction tube including a lower end portion to a temperature equal to or in excess of the melting point of silicon;
   wherein the silicon production apparatus further includes temperature lowering prevention means for preventing temperature lowering at the lower end portion of the reaction tube during heating with the high frequency heating coil,
   the temperature lowering prevention means being disposed at a lower position from the lower end portion of the reaction tube and being provided with a heating means, the temperature lowering prevention means heats atmosphere near the lower end portion of the reaction tube.

2. The silicon production apparatus according to claim 1, wherein the temperature lowering prevention means is an infrared device capable of heating the outer periphery of the reaction tube lower end portion by means of infrared rays.

3. The silicon production apparatus according to claim 2, wherein the infrared device comprises:
   an infrared member comprising a carbon material, the infrared member being provided around the outer periphery of the reaction tube lower end portion away from the lower end portion; and
   the high frequency heating coil provided around the outer periphery of the infrared member so as to heat the infrared member.

4. The silicon production apparatus according to claim 1, wherein a thermal insulating member is provided around the outer periphery of the reaction tube to prevent heat release from the reaction tube.

5. The silicon production apparatus according to claim 1, wherein the lower end portion of the reaction tube ranges up to intersections between:
   straight lines extending from the intersection of a horizontal surface leveling with the lowermost end of the reaction tube and the central axis of the reaction tube, the straight lines each having an angle of 45 degrees relative to the horizontal surface; and
   perpendicular lines extending along the inner peripheral surface of the reaction tube in the axial direction, the perpendicular lines originating from the shortest straight line of the straight lines halving an opening shape of the reaction tube.

* * * * *